United States Patent
Abedifard

(10) Patent No.: US 7,095,653 B2
(45) Date of Patent: Aug. 22, 2006

(54) COMMON WORDLINE FLASH ARRAY ARCHITECTURE

(75) Inventor: Ebrahim Abedifard, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 18 days.

(21) Appl. No.: 10/681,414

(22) Filed: Oct. 8, 2003

(65) Prior Publication Data

US 2005/0078517 A1   Apr. 14, 2005

(51) Int. Cl.
G11C 16/04 (2006.01)
(52) U.S. Cl. .............................. 365/185.17
(58) Field of Classification Search ......... 365/185.17, 365/230.06, 230.03
See application file for complete search history.

(56) References Cited

U.S. PATENT DOCUMENTS

| | | | | |
|---|---|---|---|---|
| 5,249,158 A * | 9/1993 | Kynett et al. | ......... | 365/185.11 |
| 5,337,273 A * | 8/1994 | McClure | ................ | 365/168 |
| 5,406,521 A * | 4/1995 | Hara | .................... | 365/185.25 |
| 5,406,524 A * | 4/1995 | Kawamura et al. | ..... | 365/185.27 |
| 5,426,608 A | 6/1995 | Higashitani | | |
| 5,473,563 A * | 12/1995 | Suh et al. | ............. | 365/185.13 |
| 5,959,884 A | 9/1999 | Chevallier | | |
| 5,986,947 A * | 11/1999 | Choi et al. | ............. | 365/189.11 |
| 6,064,621 A * | 5/2000 | Tanizaki et al. | ....... | 365/230.03 |
| 6,125,076 A | 9/2000 | Ishikawa | | |
| 6,137,730 A * | 10/2000 | Chien | ................... | 365/189.02 |
| 6,331,963 B1 * | 12/2001 | Cho | ....................... | 365/230.03 |
| 6,486,023 B1 * | 11/2002 | Nagata | ...................... | 438/241 |
| 6,594,194 B1 | 7/2003 | Gold | | |
| 6,605,986 B1 * | 8/2003 | Tanzawa et al. | ........... | 365/226 |
| 6,714,451 B1 * | 3/2004 | Ooishi et al. | .......... | 365/185.09 |
| 6,747,901 B1 * | 6/2004 | Hirano | .................. | 365/185.29 |
| 2002/0051383 A1 | 5/2002 | Mangan | | |

* cited by examiner

Primary Examiner—Thong Q. Le
(74) Attorney, Agent, or Firm—Leffert Jay & Polglaze, P.A.

(57) ABSTRACT

The memory area on a die required for row (X) and column (Y) decoders is reduced by a plurality of memory array blocks sharing wordlines to a single row decoder. During erase operations, the p-well of unselected memory array blocks is pulled negative to substantially the same potential as the wordline to avoid erase disturbances. During programming operations, the unselected p-wells are pulled high to avoid gate disturbances.

13 Claims, 5 Drawing Sheets

COMMON WORDLINE FLASH ARRAY ARCHITECTURE

TECHNICAL FIELD OF THE INVENTION

The present invention relates generally to memory devices and in particular the present invention relates to a memory device having shared wordlines.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

A typical flash memory comprises a memory array, which includes a large number of memory cells arranged in blocks. The flash memory is differentiated from other non-volatile memory in that flash memory cells can be erased and reprogrammed in blocks instead of one byte at a time.

The memory blocks each have a row or X-decoder. A column or Y-decoder is shared by multiple memory blocks. An example of a typical memory block architecture is illustrated in FIG. 1. This architecture uses an X-decoder for each block of memory.

FIG. 1 shows two columns 120 and 121 of memory blocks. Each column 120 and 121 is comprised of eight flash memory array blocks 110–115. Each memory array block 110–115 has a dedicated X-decoder 101–106 respectively. Additionally, each column 120 and 121 has a sense amplifier 130 and 131 that is coupled to a sense amplifier driver 140 and 141.

In order for memory manufacturers to remain competitive, memory designers must constantly increase the density of flash memory devices. This is typically accomplished by reducing the size of the flash memory arrays. The size of the address decoder (e.g., X-decoder, Y-decoder), however, is not shrinking. In fact, as the memory array size is reduced, the proportion of the die that is made up of X-decoders increases. This ultimately limits amount of memory arrays that can fit on one die.

For the reasons stated above, and for other reasons stated below which will become apparent to those skilled in the art upon reading and understanding the present specification, there is a need in the art for a memory array architecture that reduces the amount of die space occupied by address decoders.

SUMMARY

The above-mentioned problems with address decoder die space and other problems are addressed by the present invention and will be understood by reading and studying the following specification.

The present invention encompasses a memory device having a plurality of memory array blocks. Each memory array block has a plurality of memory cells that are arranged in rows. The rows are coupled together by wordlines. A row decoder is coupled to the plurality of memory array blocks through the wordlines.

Further embodiments of the invention include methods and apparatus of varying scope.

DETAILED DESCRIPTION

Figure 1:
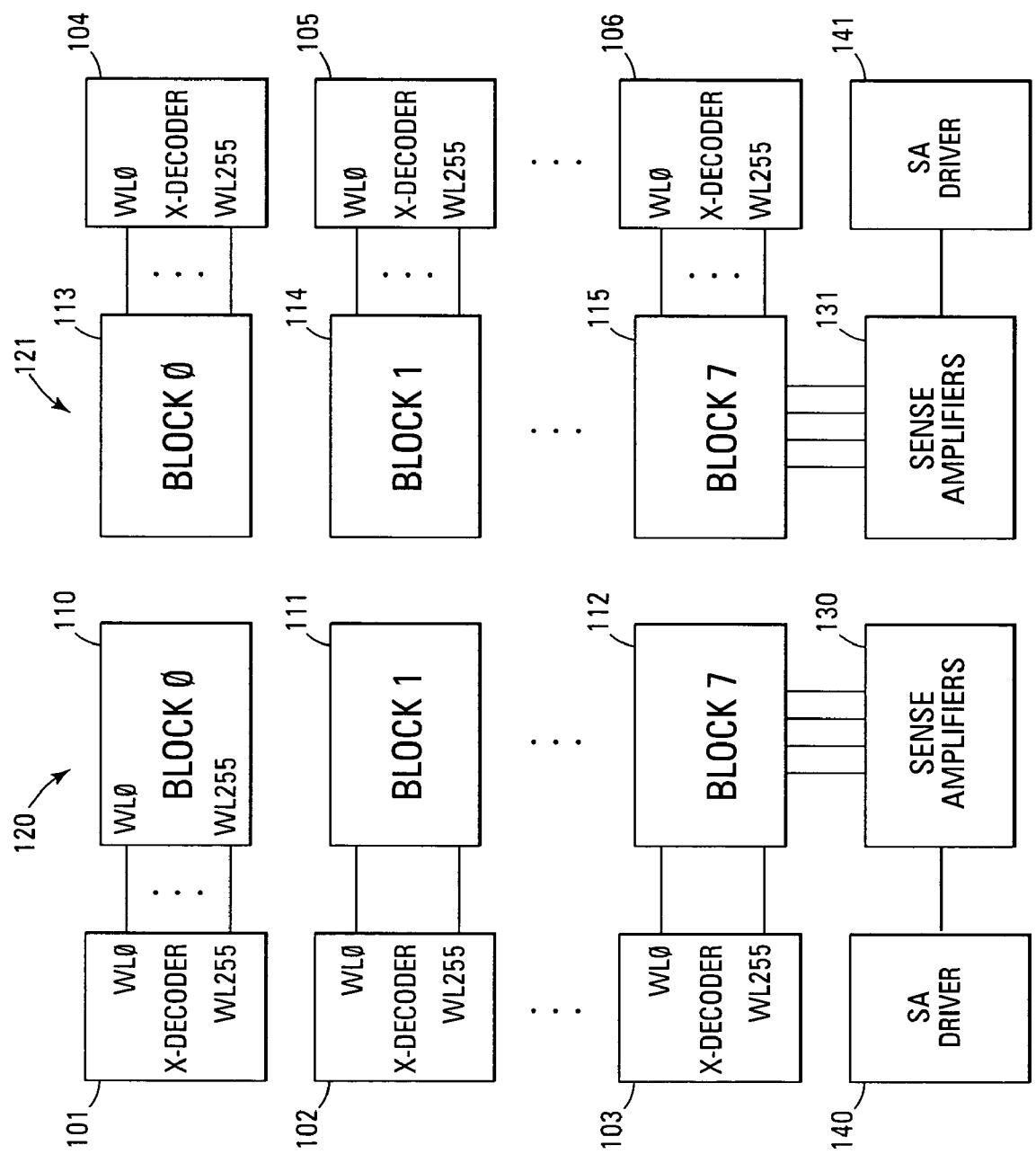
FIG. 1 shows a block diagram of a typical prior art memory block architecture.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 2:
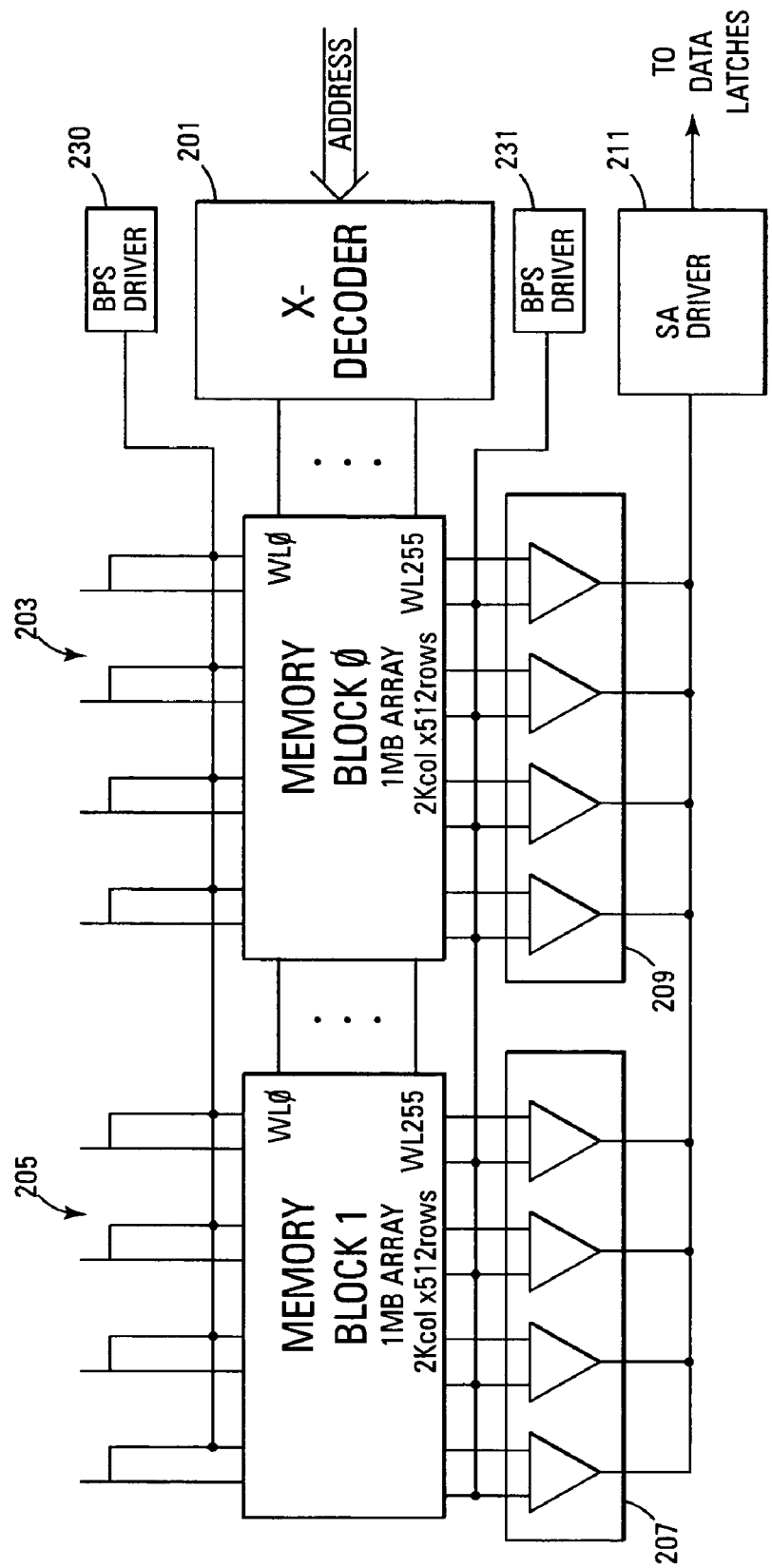
FIG. 2 shows a block diagram of one embodiment of the common wordline array architecture of the present invention.

FIG. 2 illustrates a block diagram of one embodiment of the common wordline array architecture of the present invention. The memory blocks 203 and 205 are coupled such that they share common wordlines WL0–WL255 to one X-decoder 201. In one embodiment, the memory blocks are one megabyte memory arrays requiring 256 wordlines. Alternate embodiments use other size memory arrays and, therefore, require different quantities of wordlines.

An externally applied address is input to the X-decoder 201. This circuit 201 activates the desired wordline WL0–WL255 in response to the input address signals.

Sense amplifiers 207 and 209 are located at the outputs of the memory arrays 203 and 205. The sense amplifier 207 and 209 are used during the read operation to compare currents from the selected memory cells and output the data. The operation of sense amplifiers is well known in the art and is not discussed further.

The embodiment of FIG. 2 is a global bit line architecture that uses a Block Pass Select (BPS) driver 230 and 231 to drive the bit line pairs. The global bit line architecture is well known in the art and is not discussed further.

Figure 3:
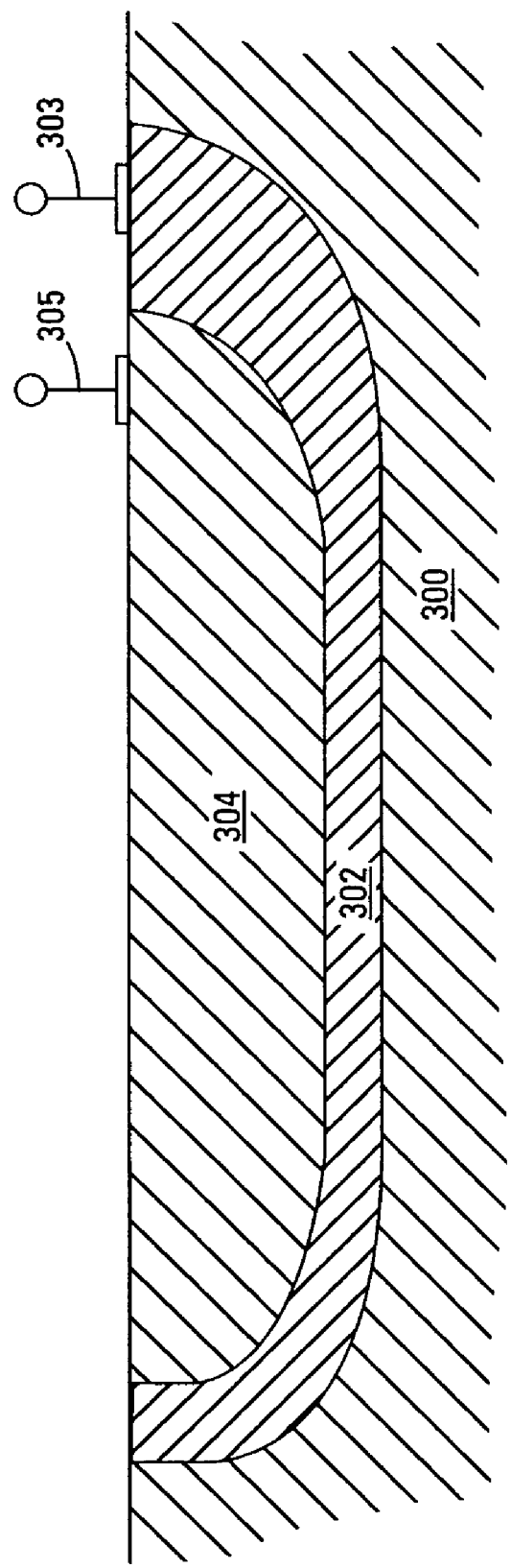
FIG. 3 shows a cross-sectional view of a structure suitable for use in fabricating the memory cells of the common wordline array architecture of the present invention.

FIG. 3 illustrates a cross-sectional view of a structure suitable for use in fabricating the memory arrays of the present invention. The substrate 300 has a first conductivity type (e.g., a p-type conductivity). The substrate 300 includes a lower well region 302 as a semiconductor region having a second conductivity type different from the first conductivity type. For example, the second conductivity type may be opposite the first conductivity type (e.g., an n-type conductivity).

The substrate 300 further includes an upper well region 304 as a semiconductor region having the first conductivity type. The upper well region 304 may be formed in the lower well region 302. The upper well region 304 is isolated from other portions of the substrate 300 having the first conductivity type by the lower well region 302. The lower well region 302 has at least one contact 303 for coupling to a potential node. The upper well region 304 has at least one contact 305 for coupling to another potential node.

For one embodiment, the structure of FIG. 3 is a deep n-well 302 formed in a p-type substrate 300. An isolating p-well 304 is located in the n-well 302. Each memory array of FIG. 2 is formed into a separate n-well 304 and isolation p-well 304.

In a normal global bit line architecture, a p-well voltage might be 0V for all operations (e.g., read, erase, program) and 0V or $V_{CC}$ for an n-well voltage. The common wordline array architecture of the present invention applies different voltages to unselected p-wells and n-wells in order to create an inhibit so as not to disturb the unselected flash cells.

During a program operation, in one embodiment, the unselected p-wells and n-wells have +5V applied in order to inhibit the operation of cells that share the same wordline as a selected cell. During an erase operation, in one embodiment, the unselected p-wells on the same word line have −5V applied and the unselected n-wells on the same word line have 0V applied. During an erase operation, in one embodiment, the unselected p-wells and n-wells have 0V applied. Alternate embodiments may use other inhibit voltages to prevent the unselected flash cells from disturbing the desired operation.

Figure 4:
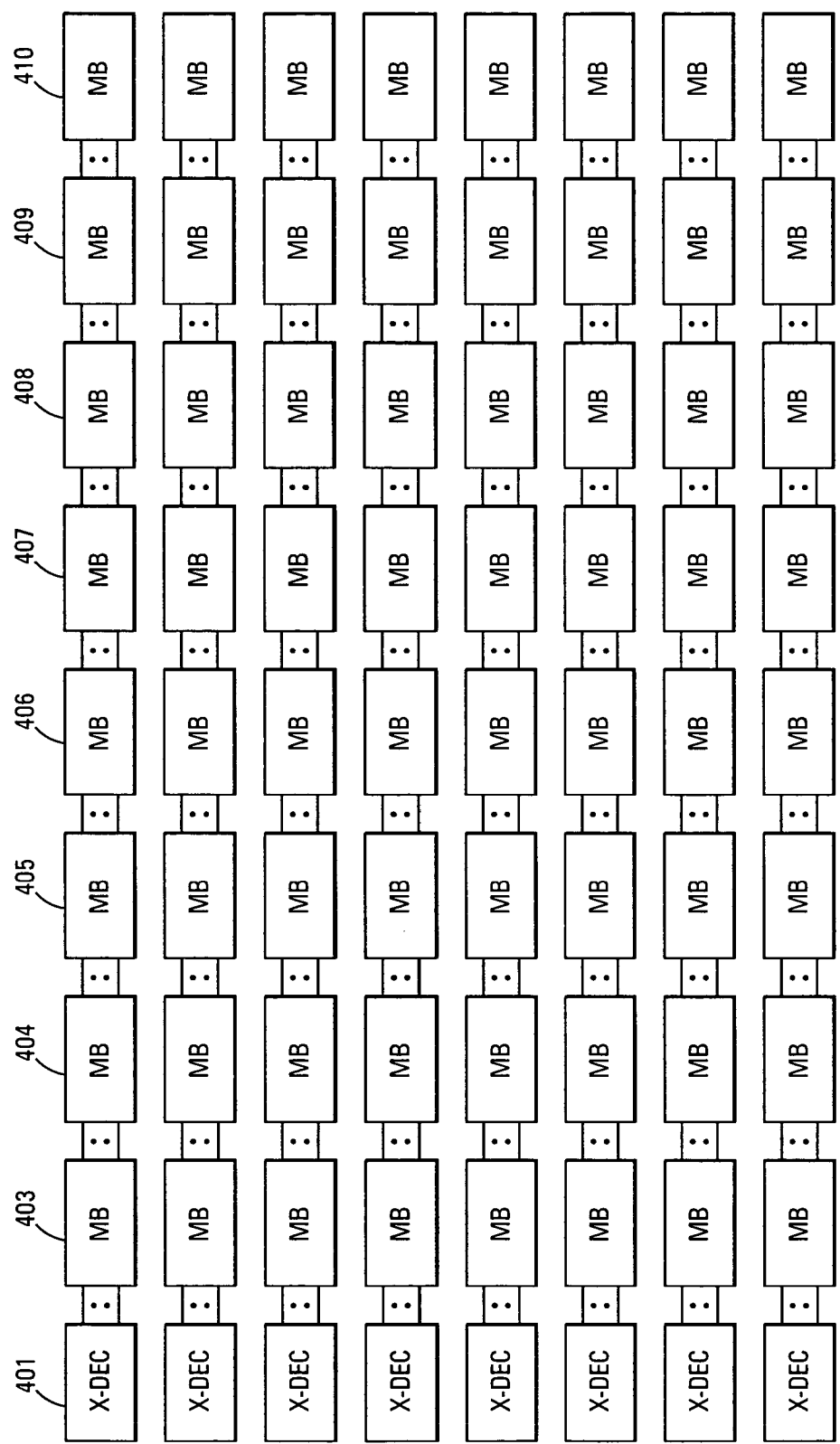
FIG. 4 shows a block diagram of one embodiment of a memory device in accordance with the common wordline array architecture of the present invention.

FIG. 4 illustrates a block diagram of one embodiment of a memory device in accordance with the common wordline array architecture of the present invention. In this embodiment, eight memory blocks 403–410 share 256 wordlines with one X-decoder 401. In a 64 MB flash memory device, there are eight X-decoders that each share wordlines with eight one megabyte memory blocks. Alternate embodiments that have different memory densities use a different quantity of memory blocks for each X-decoder. The maximum length of one wordline is typically defined by the maximum allowable cells on one wordline without impacting its speed.

Since the quantity of cell rows in the memory array is increased, the quantity of Y-decoders required to address the array is decreased. This further decreases the amount of die space required for decoders.

Figure 5:
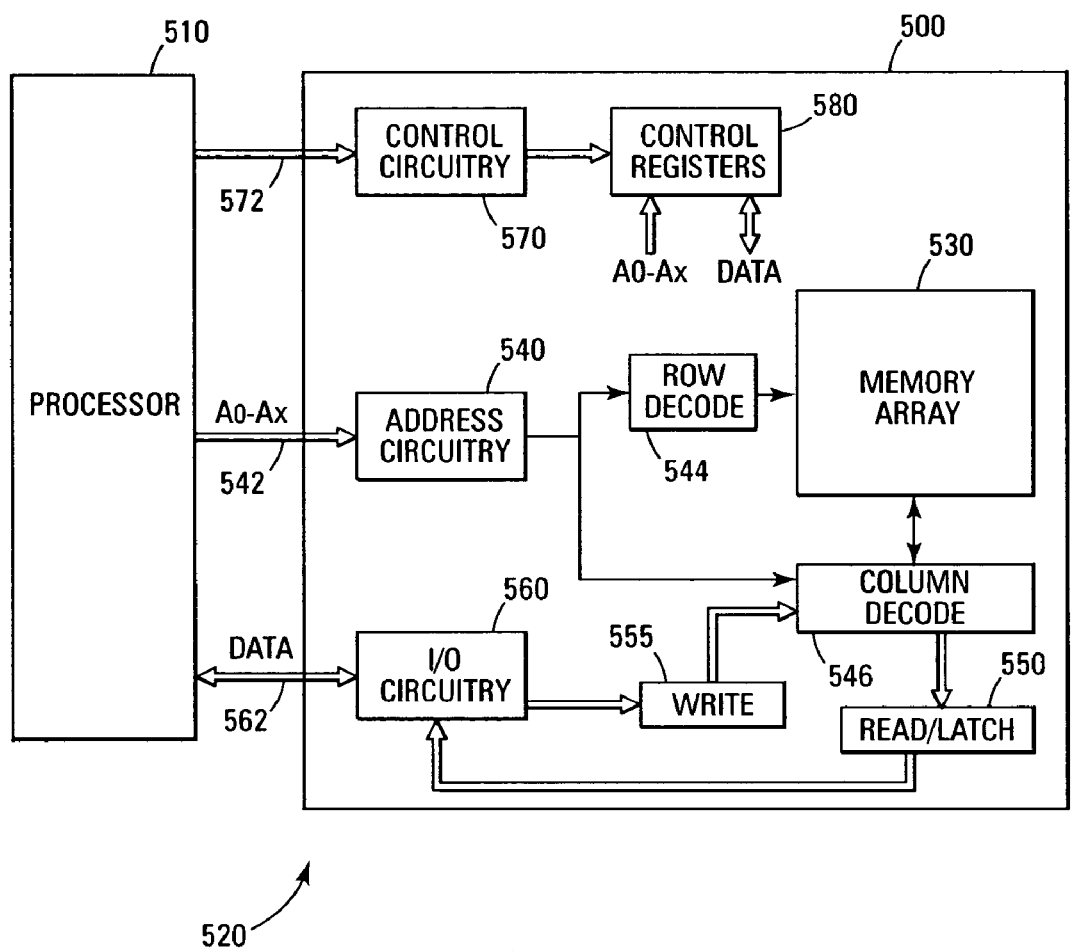
FIG. 5 shows a block diagram of one embodiment of an electronic system of the present invention.

FIG. 5 illustrates a functional block diagram of a memory device 500 of one embodiment of the present invention that is coupled to a processor 510. The processor 510 may be a microprocessor, a processor, or some other type of controlling circuitry. The memory device 500 and the processor 510 form part of an electronic system 520. The memory device 500 has been simplified to focus on features of the memory that are helpful in understanding the present invention.

The memory device includes an array of memory cells 530. In one embodiment, the memory cells are non-volatile floating-gate memory cells and the memory array 530 is arranged in banks of rows and columns.

An address buffer circuit 540 is provided to latch address signals provided on address input connections A0–Ax 342. Address signals are received and decoded by a row decoder (X-decoder) 544 and a column decoder (Y-decoder) 546 to access the memory array 530. It will be appreciated by those skilled in the art, with the benefit of the present description, that the number of address input connections depends on the density and architecture of the memory array 530. That is, the number of addresses increases with both increased memory cell counts and increased bank and block counts.

The memory device 500 reads data in the memory array 530 by sensing voltage or current changes in the memory array columns using sense/latch circuitry 550. The sense/latch circuitry, in one embodiment, is coupled to read and latch a row of data from the memory array 530. Data input and output buffer circuitry 560 is included for bi-directional data communication over a plurality of data connections 562 with the controller 510. Write circuitry 555 is provided to write data to the memory array.

Control circuitry 570 decodes signals provided on control connections 572 from the processor 510. These signals are used to control the operations on the memory array 530, including data read, data write, and erase operations. In one embodiment, the control circuitry 570 executes the error correction schemes of the present invention. The control circuitry 570 may be a state machine, a sequencer, or some other type of controller.

The flash memory device illustrated in FIG. 5 has been simplified to facilitate a basic understanding of the features of the memory. A more detailed understanding of internal circuitry and functions of flash memories are known to those skilled in the art.

The above-described embodiments of the present invention are discussed with reference to a flash memory device, including both NAND and NOR-type flash devices. However, the present invention is not limited to any one type of memory device. Any memory device that would benefit from sharing wordlines to reduce decoder area is encompassed by the present invention.

CONCLUSION

In summary, a common wordline architecture uses one X-decoder with multiple memory blocks sharing the same wordlines. This decreases the quantity of X and Y-decoders required and improves memory device performance due to a die size reduction.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A flash memory device comprising:
   a plurality of n-wells comprising an n-type conductivity material formed in a p-type substrate;
   a plurality of p-wells comprising a p-type conductivity material, each p-well located within a different n-well;
   a plurality of flash memory array blocks, each comprising a plurality of flash memory cells arranged in rows that are coupled together by a first set of wordlines of a plurality of sets of wordlines, each flash memory array block located within a different p-well of the plurality of p-wells wherein a voltage differential of 5V is applied between the n-well and the p-well of an unselected flash memory array block during an erase operation; and
   a first row decoder coupled to the plurality of memory array blocks through the first set of wordlines, external address signals coupled to the first row decoder such that a wordline of the first set of wordlines is selected in response to the address signals.

2. The flash memory device of claim 1 wherein a voltage of 0V is applied to the n-well and a voltage of −5V is applied to the p-well of an unselected flash memory array block during an erase operation.

3. The flash memory device of claim 1 wherein a voltage of 5V is applied to the n-well and a voltage of 5V is applied to the p-well of an unselected flash memory array block during a program operation.

4. A flash memory device comprising:
  a plurality of lower wells comprising a first conductivity material formed in a substrate comprising a second conductivity material;
  a plurality of isolation wells comprising the second conductivity material, each isolation well located within a different lower well;
  a plurality of flash memory array blocks, each comprising a plurality of flash memory cells arranged in rows that are coupled together by a first set of wordlines of a plurality of sets of wordlines, each flash memory array block located within a different isolation well of the plurality of isolation wells wherein a voltage differential of 5V is applied between the lower well and the isolation well of an unselected flash memory array block during an erase operation; and
  a first row decoder coupled to the plurality of memory array blocks through the first set of wordlines, external address signals coupled to the first row decoder such that a wordline of the first set of wordlines is selected in response to the address signals.

5. The flash memory device of claim 4 wherein a voltage of 0V is applied to the lower well and a voltage of −5V is applied to the isolation well of an unselected flash memory array block during an erase operation.

6. The flash memory device of claim 4 wherein a voltage of 5V is applied to the lower well and a voltage of 5V is applied to the isolation well of an unselected flash memory array block during a program operation.

7. The flash memory device of claim 4 wherein the first conductivity material is an n-type conductivity material.

8. The flash memory device of claim 4 wherein the second conductivity material is a p-type conductivity material.

9. A method for programming a memory cell in a memory array block of a plurality of memory array blocks, each memory array block located within a first conductivity material that is located within a second conductivity material, the method comprising:
  generating an address signal of the memory cell;
  a row decoder selecting, in response to the address signal, a wordline signal that is coupled to the memory cell, the wordline signal additionally coupled to the plurality of memory array blocks;
  coupling a first voltage that is greater than 0V to the first conductivity material of memory array blocks that are not selected by the wordline signal; and
  coupling a second voltage that is greater than 0V to the second conductivity material of memory array blocks that are not selected by the wordline signal wherein a voltage differential of 5V is applied between the first conductivity material and the second conductivity material of an unselected memory array block.

10. The method of claim 9 wherein the first and second voltages are substantially equal to +5V.

11. A method for erasing a memory cell in a memory array block of a plurality of memory array blocks, each memory array block located within a first conductivity material that is located within a second conductivity material, the method comprising:
  generating an address signal of the memory cell;
  a row decoder selecting, in response to the address signal, a wordline signal that is coupled to the memory cell, the wordline signal additionally coupled to the plurality of memory array blocks; and
  coupling a voltage that is substantially equal to -5V to the second conductivity material of memory array blocks that are not selected by the wordline signal.

12. The method of claim 11 wherein the voltage is substantially equal to 5V.

13. An electronic system comprising:
  a processor that controls operation of the electronic system and generates address signals; and
  a flash memory device coupled to the processor, the device comprising:
    a plurality of lower wells comprising a first conductivity material formed in a substrate comprising a second conductivity material;
    a plurality of isolation wells comprising the second conductivity material, each isolation well located within a different lower well;
    a plurality of flash memory array blocks, each comprising a plurality of flash memory cells arranged in rows that are coupled together by a first set of wordlines of a plurality of sets of wordlines, each flash memory array block located within a different isolation well of the plurality of isolation wells wherein a voltage differential of 5V is applied between the lower well and the isolation well of an unselected flash memory array block during an erase operation; and
    a first row decoder coupled to the plurality of memory array blocks through the first set of wordlines, external address signals coupled to the row decoder such that a wordline of the first set of wordlines is selected in response to the address signals.

* * * * *

UNITED STATES PATENT AND TRADEMARK OFFICE
CERTIFICATE OF CORRECTION

| | |
|---|---|
| PATENT NO. | : 7,095,653 B2 |
| APPLICATION NO. | : 10/681414 |
| DATED | : August 22, 2006 |
| INVENTOR(S) | : Ebrahim Abedifard |

It is certified that error appears in the above-identified patent and that said Letters Patent is hereby corrected as shown below:

In column 4, delete lines 64-67.

In column 5, line 1 change "3" to --2--.

In column 5, line 5 change "4" to --3--.

In column 5, delete lines 26-29.

In column 5, line 30 change "6" to --4-- and "4" to --3--.

In column 5, line 34 change "7" to --5-- and "4" to --3--.

In column 5, line 36 change "8" to --6-- and "4" to --3--.

In column 5, line 38 change "9" to --7--.

In column 6 delete lines 5-6.

In column 6, line 7 change "11" to --8--.

In column 6 delete lines 21-22.

In column 6, line 23 change "13" to --9--.

Signed and Sealed this

Eighteenth Day of September, 2007

JON W. DUDAS
*Director of the United States Patent and Trademark Office*